(12) United States Patent
Tsay et al.

(10) Patent No.: US 6,204,701 B1
(45) Date of Patent: Mar. 20, 2001

(54) POWER UP DETECTION CIRCUIT

(75) Inventors: Ching-yuh Tsay, Richardson; Hugh Pryor McAdams, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/251,052

(22) Filed: May 31, 1994

(51) Int. Cl.[7] .................................................. H03K 17/30
(52) U.S. Cl. ............................ 327/143; 327/198; 327/76; 327/97
(58) Field of Search ................................. 327/142, 143, 327/198, 76, 77, 97

(56) References Cited

U.S. PATENT DOCUMENTS

| | | | |
|---|---|---|---|
| 4,234,920 | * 11/1980 | Van Ness et al. | 364/200 |
| 4,473,759 | * 9/1984 | Mahabadi | 327/50 |
| 4,746,822 | * 5/1988 | Mahoney | 307/594 |
| 4,882,506 | * 11/1989 | Johansson et al. | 327/530 |
| 4,902,910 | * 2/1990 | Hsieh | 307/296.4 |
| 5,039,875 | * 8/1991 | Chang | 307/272.3 |
| 5,063,304 | 11/1991 | Iyengar | 307/296.6 |
| 5,066,869 | 11/1991 | Neidorff | 307/272.3 |
| 5,081,625 | 1/1992 | Rhee et al. | 371/16.3 |
| 5,087,834 | 2/1992 | Tsay | 307/443 |
| 5,103,115 | 4/1992 | Ueda et al. | 307/272.3 |
| 5,103,159 | 4/1992 | Breugnot et al. | 323/315 |
| 5,120,993 | 6/1992 | Tsay et al. | 307/296.4 |
| 5,157,270 | 10/1992 | Sakai | 307/66 |
| 5,159,206 | 10/1992 | Tsay et al. | 307/272.3 |
| 5,164,613 | * 11/1992 | Mumper et al. | 327/143 |
| 5,166,545 | 11/1992 | Harrington | 307/272.3 |
| 5,168,209 | 12/1992 | Thiel | 323/313 |
| 5,181,203 | 1/1993 | Frenkil | 371/15.1 |
| 5,220,534 | 6/1993 | Redwine et al. | 365/226 |
| 5,233,161 | 8/1993 | Farwell et al. | 219/209 |
| 5,270,977 | 12/1993 | Iwamoto et al. | 365/201 |
| 5,297,261 | 3/1994 | Kuranaga | 395/325 |
| 5,347,173 | * 9/1994 | McAdams | 307/296.4 |

* cited by examiner

Primary Examiner—Timothy P. Callahan
(74) Attorney, Agent, or Firm—W. Daniel Swayze, Jr.; Wade James Brady, III; Frederick J. Telecky, Jr.

(57) ABSTRACT

A power-up detection circuit to produce a power-up detection signal detects a reference voltage of a device. After a power-up detection has been produced, a DC current path to ground is established to conduct DC current to reset the power-up detection circuit to produce a subsequent power-up detection signal.

10 Claims, 2 Drawing Sheets

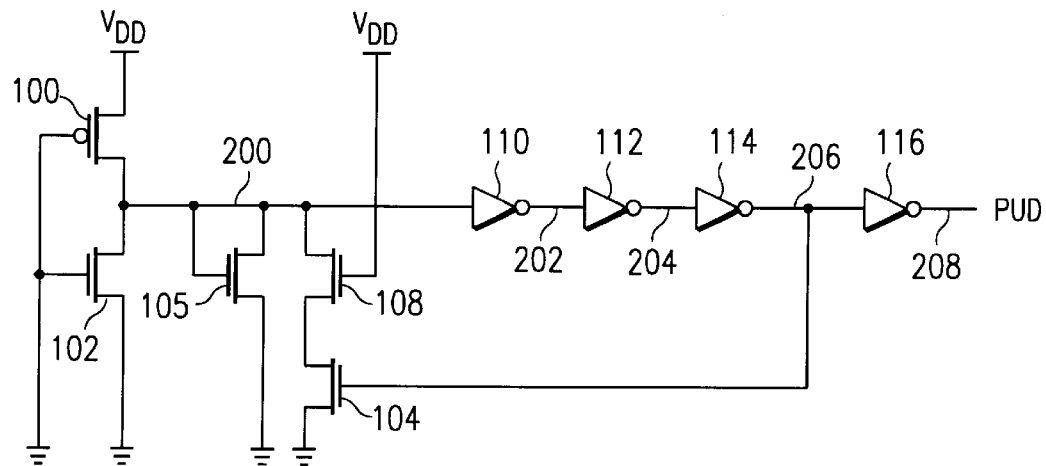
FIG. 1
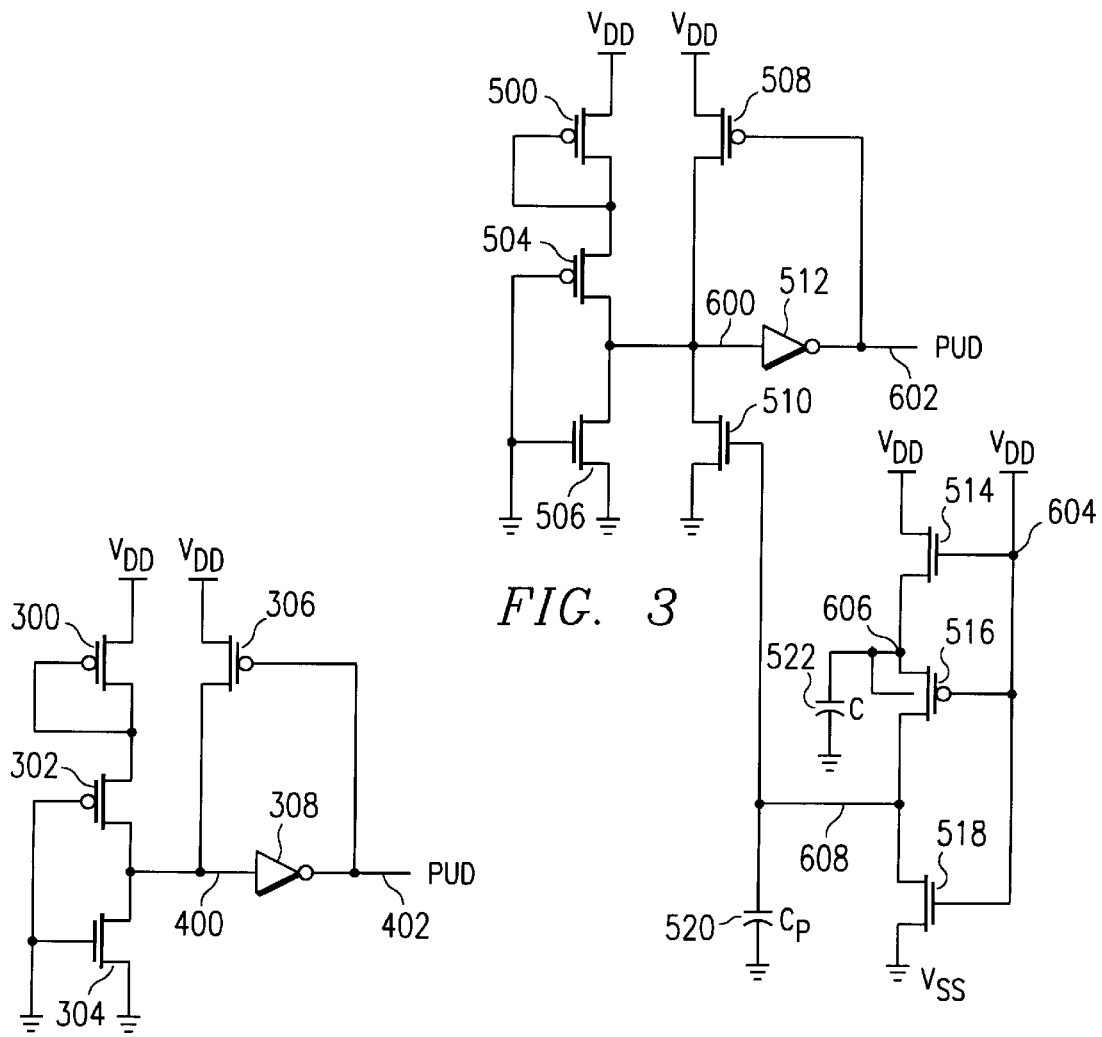
FIG. 3
FIG. 2

POWER UP DETECTION CIRCUIT

TECHNICAL FIELD OF THE INVENTION

This present invention relates to detector circuits and more particularly to power-up/power-down detector circuits.

BACKGROUND OF THE INVENTION

A problem in many integrated circuits is the detection of the initial power-on state. There are many functions which may be needed to perform at initial power-on such as self-testing, clearing garbage data from memory and restoring all elements to a known state and loading saved data.

This is particularly useful for battery-backed or battery operated integrated circuits, which may be used to perform power-management or nonvolatizing functions for an electronic system. If such a component has lost its battery power, it may loose its valid data, and may begin to issue erroneous commands to the system. Thus, a great many types of integrated circuits include a "power-on-reset" circuit to detect when power is applied after a power-down condition, and to issue a reset pulse, which is used to initiate performance of the above named functions.

Two objectives in selecting a power-on reset circuit is that the circuit must not generate the reset pulse when not needed, second, the circuit must generate the reset pulse when it is needed.

Particularly in the design of today's dynamic DRAM memories, latches may be employed to set the state of signals to predetermined logic levels during an active or a precharge portion of a memory cycle. The use of these latches may require a master reset signal to force the state of these signals or logic levels to known value subsequent to the DRAM memory powering up. This operation insures that the DRAM memory is properly conditioned in a low power standby state of the RAM memory while waiting for the first memory cycle to be applied to the RAM memory. An ideal operation, the master reset signal should follow the supply voltage until the supply voltage has reached a sufficient voltage level such that all the signals or logic levels can be reset, and then master reset signal should be returned to ground potential. With the emphasis today on utilizing only very low standby power from battery power backup systems, it is desirable that the circuit that produces this master reset signal consume little or no current once the device has been powered up. Furthermore, this reset signal should be generated every time the RAM memory is powered up regardless of the length of time between subsequent power-up intervals. This generation of the master reset signal regardless of the length of the interval of time insures that despite the power-up sequence of the RAM memory, the state of the RAM memory is properly set for correct and accurate memory operation.

These two requirements, namely that the standby current drain from the circuit to produce the master reset signal has been unsatisfactorily large or the circuit to produce the master reset signal requires an unacceptably long period of time to accurately reproduce the master reset signal between power-ups and downs has not been met by the prior art in one circuit.

FIG. 1 illustrates a power-up detector that provides a power-up detector signal, PUD. This circuit has the disadvantage of producing a large standby current drain from the power supply. The circuit has the following behavior as power is applied to the circuit. Initially nodes 200, 202, 204, 206 and 208 are at $V_{ss}$ or ground potential. As $V_{dd}$ rises to $V_{tp}$ potential, the threshold voltage of p-channel transistor 100, transistor 100 will turn on. This causes node 200 to charge toward $V_{dd}$ potential, forcing node 202 low due to the operation of invertor 110, node 204 high due to the action of invertor 112, node 206 low due to the action of invertor 114 and node 208, PUD, high due to the action of invertor 116, providing a signal to indicate the power-up condition.

As node 200 charges toward $V_{dd}$, n-channel transistor 106 will turn on, creating a voltage divider between transistor 100 and transistor 106. Since node 206 has been set low, n-channel transistor 104 is off and transistors 108 and 104 do not conduct current at this time. Transistors 100 and 106 are designed such that the potential on node 200 will not drop below the switching threshold of inverter 110 until $V_{dd}$ has reached sufficient potential to assure the proper operation of all internal circuitry and the proper initialization of all internal nodes. As $V_{dd}$ reaches the required potential where proper initialization has been achieved, the rate of increase in the potential of node 200 is less than the rate of increase in the switching threshold of inverter 110.

Thus, the potential on node 200 drops below the switching threshold of invertor 110. Node 202 is forced high due to the operation of invertor 110, node 204 is forced low due to the operation of invertor 112, node 206 is forced high due to the operation of invertor 114 and node 208, PUD is forced low due the action of invertor 116, indicating that the power up period has ended. As node 206 goes high it turns on transistor 104. A discharging path through devices 108 and 104 is thus created that pulls node 200 close to ground, $V_{ss}$, potential. This feedback path is provided to insure that node 200 does not oscillate around the switching threshold of invertor 110, due to supply noise, and cause multiple PUD signals. Because of the feedback path, there is a continuous current path from $V_{dd}$ to $V_{ss}$ while the circuit is powered on.

For example, the current may be in the 50 micro amp-range. This is a very significant contribution to the overall current of the device used with the power-up detector and as a consequence resulting in inefficiencies.

FIG. 2 illustrates a power-up detector circuit that effectively eliminates this standby current; however, it has the disadvantage that during a power-up-down-up sequence of short duration, the power-up detector circuit fails to provide a power-up detection signal on the last power-up.

The operation of FIG. 2 is as follows. Before initial power-up, node 400 is at ground, $V_{ss}$, potential. As $V_{dd}$ rises to $V_{tp}$, the threshold voltage of the p-channel transistor in invertor 308, node 402, PUD, goes high, providing a signal to indicate the power-up condition. P-channel transistor 306 is designed to have a higher threshold voltage than $V_{tp}$ so that it will not turn on before invertor 308 forces PUD high, thereby assuring that transistor 306 remains off. Node 400 will remain low until $V_{dd}$ exceeds the sum of the threshold voltage of p-channel transistor 300 and the threshold voltage of p-channel transistor 302. PUD will remain high until node 400 reaches the switching threshold of invertor 308. $V_{dd}$ must exceed this threshold by the sum of the thresholds of transistors 300 and 302. This voltage level is sufficient to insure the proper operation of all internal circuitry and to insure the proper initialization of all internal nodes. Once node 400 exceeds the switching threshold of invertor 308, node 402 is forced low, indicating that the power-up period has ended. When node 402 goes low, transistor 306 is turned on, pulling node 400 to $V_{dd}$ potential. This assures that there is no current path in invertor 308 due to an intermediate voltage level on node 400. This circuit draws no current while the device is powered on.

The circuit of FIG. 2 has the disadvantage of not detecting a second power-up sequence if it occurs too soon after a power-down. The problem can be seen from the following discussion. Recall that after power-up, node 400 was brought to $V_{dd}$ potential. When the device is powered down the only discharge path for node 400 is through transistor 306. Node 400 will follow the $V_{dd}$ supply as it is discharged until $V_{dd}$ reaches a potential of $V_{tp}$, where $V_{tp}$ is the threshold voltage of p-channel transistor 306. Thus, when the $V_{dd}$ supply is fully discharged to ground, node 400 is still at $V_{tp}$ potential. The only way that node 400 can be fully discharged to ground is through junction and subthreshold leakage. These leakages are very small, requiring on the order of seconds to discharge node 400 to ground potential. If power-up is attempted before node 400 has been sufficiently discharged, the circuit will not provide a power-up detect signal. This failure is due to node 400 remaining at greater than a $V_{tn}$ potential, where $V_{tn}$ is the threshold voltage of the n-channel transistor in invertor 308. If this occurs, node 402 will be held at a low state during the second power-up sequence, improperly indicating that the power-up period has ended.

SUMMARY OF THE INVENTION

The present invention provides a power up detection circuit that uses little or no standby current, and, as a consequence, the power-up detection circuit of the present invention saves a significant amount of power. Furthermore, the power-up detection circuit of the present invention eliminates the problem of being unable to detect a subsequent power-up condition by being in such a state that the power-up detection circuit provides a second power-up detection signal even though a first power-up signal has been previously provided.

SUMMARY OF THE DRAWINGS

These and other features of the invention will be apparent to those skilled in the art from the following detailed description of the invention, taken together with the accompanying drawings in which:

FIG. 1 is illustrates a power-up detection circuit using a continuous standby current;

FIG. 2 illustrates a power-up detection circuit, unable to provide a second power-up detection signal;

FIG. 3 illustrates a circuit diagram of the present invention;

DESCRIPTION OF THE INVENTION

Figure 4:
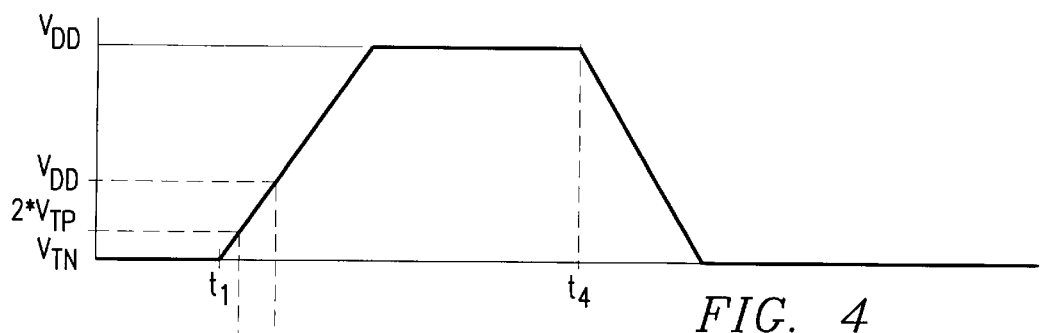
FIG. 4 illustrates a relationship between $V_{dd}$ voltage and time.

The present invention and its advantageous are understood by referring to FIGS. 1–7 of the drawings, like numerals being used for like and corresponding parts of the various drawings.

FIG. 3 illustrates a P-channel type transistor 500 having the source of the transistor 500 connected to a bias of $V_{dd}$ voltage level, and a gate and drain of the transistor 500 being connected to node 610. A P-channel transistor 504 has a source of the transistor 504 connected to the drain of transistor 500 at node 610 while the gate of the transistor 504 is connected to ground potential, for example $V_{ss}$. The drain of transistor 504 is connected to the drain of transistor 510 at node 600. An N-channel transistor 506 has a drain of transistor 506 connected to the drain of transistor 504 at node 600, while a gate and source of transistor 506 is connected to ground potential. Furthermore, FIG. 3 illustrates that P-channel transistor 508 has its source connected to a terminal such that it is bias at $V_{dd}$ while the drain of the transistor 508 is connected to drain of transistor 510 at node 600, and the gate of the transistor 508 is connected to the output of inverter 512 at node 602 which indicates the power-up detection signal. Inverter 512 has an input of the inverter 512 connected to the drains of transistor 508 and 510 at node 600 and an output inverter 512 is connected to node 602 to indicate the PUD signal. The inverter 512 inverts the input signal to the inverter. The N-channel transistor 510 has a drain of the transistor 510 connected to node 600 while the source of transistor 510 is connected to ground potential.

N-channel transistor 514 has a drain of transistor 514 connected to a bias at voltage level $V_{dd}$. Transistor 514 has a gate of transistor 514 connected to node 604, which is bias at voltage level $V_{dd}$. A source of transistor 514 is connected to node 606 in order to provide a path to charge capacitor 522. A gate of P-channel transistor 516 is connected to the gate of transistor 514 at node 604 and are bias at a voltage level of $V_{dd}$. A drain of transistor 516 is connected to a drain of N-channel transistor 518. Transistor 516 provides a path for charging capacitor 520 from capacitor 522 when $V_{dd}$ is powered down. Furthermore, the source of transistor 516 is connected to a substrate of transistor 516. A gate of transistor 518 is connected to the gate of transistor 516 at node 604 and is biased at voltage level $V_{dd}$. A source of transistor 518 is connected to ground potential. Capacitor 522 is connected to both the source of transistor 514 and the source of transistor 516 to provide a source of voltage. Capacitor 520 is shown to represent the parasitic capacitance of node 608 in an actual circuit implementation.

FIG. 4 illustrates the relationship between time and the voltage level $V_{dd}$. Ideally the voltage level of $V_{dd}$ ramps up to a predetermined level until such time that the system is shut down, and $V_{dd}$ goes to zero. The operation of the power-up circuit of FIG. 3 is described next. Initially, node 600 is at ground potential, for example $V_{ss}$. As illustrated in FIG. 4 at T1, $V_{dd}$ begins to increase with node 600 being at a voltage level of ground potential. The inverter 512 outputs a logical high voltage to provide a power-up detection signal at node 602. The logical high voltage level at node 602 maintains transistor 508 in a non-conducting state. Further as $V_{dd}$ increases to the voltage level of the threshold of transistor 518, transistor 518 provides a conduction path between the source and drain of transistor 518. While the conduction path is established between the source and drain of transistor 518, node 608 is maintained at ground potential. Furthermore, as $V_{dd}$ rises the transistor 516 will remain off, since its gate potential is never negative with respect to node 606 or node 608, preventing any conduction path through the source and drain of transistors 514, 516 and 518. As $V_{dd}$ rises to a level of the threshold of N-channel transistor 514, transistor 514 provides a conduction path between the drain and source of transistor 514 and capacitor 522 to provide a charging current in order to charge capacitor 522.

Figure 5:
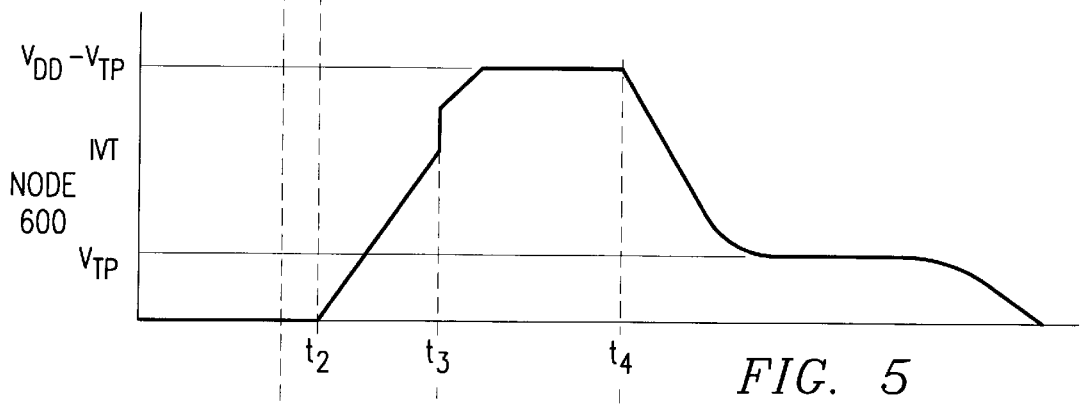
FIG. 5 illustrates a relationship between the voltage at node 600 of the power-up detection circuit of FIG. 3.
Figure 6:
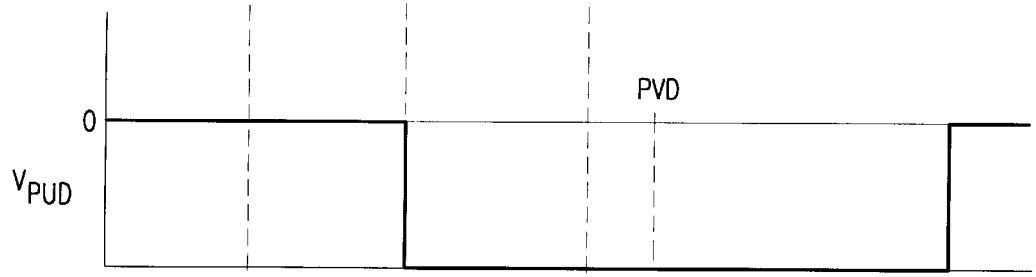
FIG. 6 illustrates the relationship between the voltage at node 602 of the circuit diagram of FIG. 3 and time.
Figure 7:
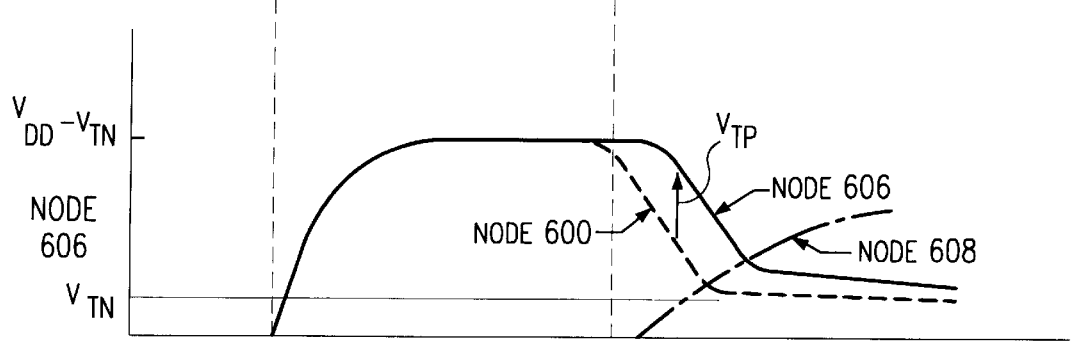
FIG. 7 illustrates the relationship between node 600 and node 606 and time.

As $V_{dd}$ reaches $2V_{tp}$ the threshold voltage of the P-channel transistor, the transistor 500 and transistor 504 turn on and provides a conduction path between $V_{dd}$ and node 600. As illustrated in FIG. 5, at T2, node 600 begins to rise in accordance with $V_{dd}$ minus $2V_{tp}$. The voltage at node 600 continues to rise until the voltage at node 600 reaches the switching threshold of inverter 512, and as illustrated in FIG. 6 at T3, a logical low signal at node 602 is produced indicating that the power-up period has ended. This logical low signal at node 602 is applied to the gate of transistor 508 causing transistor 508 to turn on. Transistor 508 provides a conduction path between the source and drain of transistor 508. This conduction path of transistor 508 pulls node 600 to the voltage level of $V_{dd}$.

At T4, when $V_{dd}$ begins to power off as illustrated by FIG. 5 capacitor 522 is charged to $V_{dd}$-$V_{tn}$. The voltage at node 600 falls with $V_{dd}$ only to the $V_{tp}$ level, as the conduction path through transistor 508 is eliminated as $V_{dd}$ drops below the threshold voltage $V_{tp}$ of transistor 508. At T4 when $V_{dd}$ begins to fall during power-off, transistor 514 turns off since its gate voltage has fallen to less than a $V_{tn}$ voltage above its source potential. The charge on capacitor 522 is trapped until $V_{dd}$ has fallen to potential of $V_{dd}$ (power-on)-$V_{tn}$-$V_{tp}$, at which time transistor 516 turns on to being discharging node 606 through transistors 516 and 518. Node 606 will follow $V_{dd}$ as it is discharged at a level of $V_{dd}$+$V_{tp}$ until $V_{dd}$ reaches a potential of $V_{tn}$. At this point transistor 518 turns off, since there is no longer sufficient gate to source voltage to maintain it in a conductive state. At this point node 606 can be at a potential no less than $V_{tp}$+$V_{tn}$. As transistor 518 turns off and $V_{dd}$ continues to fall towards ground, capacitor 522 begins to share its charge with parasitic capacitor 520, since transistor 516 continues to be in a conductive state. Capacitor 522 is such that the capacitance of capacitor 522 is much greater than the parasitic capacitance of capacitor 520, so that the resultant voltage on nodes 606 and 608, after charge sharing is complete, is above $V_{tn}$. If the capacitance of capacitor 522 is sufficiently larger than that of parasitic capacitor 520, the resultant voltage after charge sharing, is close to $V_{tp}$+$V_{tn}$. This causes transistor 516 to be in triode mode, assuring the maximum voltage possible on the gate of transistor 510, node 608.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A device to produce a first power-up detection signal comprising:
    a reference generator circuit for producing a reference voltage;
    detection circuit coupled to said reference generator circuit to detect said reference voltage as power is being applied to said device;
    power-up circuitry coupled to said detection circuitry to produce said first power-up detection signal based on said reference voltage;
    reset circuitry coupled to said power-up circuitry to reset said power-up circuitry by establishing a DC current path from said power-up circuitry to ground to conduct DC current on said DC current path after said first power up detection signal has been produced and only after the reference voltage has reached a threshold voltage of a transistor of said reset circuit in order to reset said power-up circuitry to produce a second power-up detection signal after said first power-up detection.

2. A device to produce a first power detection signal as in claim 1, wherein reset circuitry includes a transistor to conduct said DC current along said DC current path after said first power-up detection signal has been produced.

3. A device to produce a first power detection signal as in claim 2, wherein said transistor is enabled by a charged capacitor.

4. A device to produce a first power detection signal comprising:
    a reference generator circuit for producing a reference voltage; detection circuit coupled to said reference generator circuit to detect said reference voltage as power is being applied to said device;
    power-up circuitry coupled to said detection circuity to produce said first power-up detection signal based on said reference voltage;
    reset circuitry coupled to said power-up circuitry to reset said power-up circuitry by establishing a DC current path to ground to conduct DC current on said DC current path after said first power up detection signal has been produced in order to reset said power-up circuitry to produce a second power-up detection signal after said first power-up detection, wherein said reset circuitry includes a transistor to conduct said DC current along said DC current path after said first power-up detection signal has been produced, wherein said reset circuitry includes storage circuitry to provide a source of power as said reference voltage is turned off.

5. A device to produce a first power detection signal as in claim 4, wherein said transistor is enabled by a charged capacitor, said charged capacitor coupled to said storage circuit to charge said capacitor from said reference voltage.

6. A power-up detection circuitry to produce first power-up detection signal comprising:
    input circuitry to receive a reference voltage;
    detection circuitry coupled to said input circuitry to detect said reference voltage as power is being applied to said power-up detection circuitry;
    power-up circuitry coupled to said detection circuitry to produce said first power-up detection signal based on said reference voltage;
    reset circuitry coupled to said power-up circuitry to reset said power-up circuit by establishing a DC current path from said power-up circuitry to ground to conduct DC current on said DC current path after said first power-up detection has been produced and only after the reference voltage has reached a threshold voltage of a transistor of said reset circuit in order to reset said power-up circuit to produce a second power-up detection signal on said power-up circuitry.

7. A power-up detection circuit to produce a first power detection signal as in claim 6, wherein reset circuitry includes a transistor to conduct said DC current along said DC current path after said first power-up detection signal has been produced.

8. A power-up detection circuit to produce a first power detection signal as in claim 7, wherein said transistor is enabled by a charged capacitor.

9. A power-up detection circuit to produce a first power detection signal, comprising:
    input circuitry to receive a reference voltage;
    detection circuitry coupled to said input circuitry to detect said reference voltage as power is being applied to said power-up detection circuitry;
    power-up circuitry coupled to said detection circuitry to produce said first power-up detection signal based on said reference voltage;

reset circuitry coupled to said power-up circuitry to reset said power-up circuit by establishing a DC current path to ground to conduct DC current on said DC current path after said first power-up detection has been produced in order to reset said power-up circuit to produce a second power-up detection signal on said power-up circuitry; wherein said reset circuitry includes a transistor to conduct said DC current along said DC current path after said first power-up detection signal has been produced, wherein said reset circuitry include storage circuitry to provide a source of power as said reference voltage is turned off.

10. A power-up detection circuit to produce a first power detection signal as in claim 9, wherein said transistor is enabled by a charged capacitor, said charged capacitor coupled to said storage circuit to charge said capacitor from said reference voltage.

* * * * *